United States Patent [19]

Harasawa

[11] Patent Number: 5,530,936
[45] Date of Patent: Jun. 25, 1996

[54] SEMICONDUCTOR LASER DRIVING CIRCUIT

[75] Inventor: Shinichirou Harasawa, Kawasaki, Japan

[73] Assignee: Fujitsu Limited, Kanagawa, Japan

[21] Appl. No.: 88,246

[22] Filed: Jul. 7, 1993

[30]     Foreign Application Priority Data

Sep. 29, 1992  [JP]  Japan .................................. 4-260122

[51] Int. Cl.⁶ ...................................................... H01S 3/00
[52] U.S. Cl. ........................................................ 372/38
[58] Field of Search .................................................. 372/38

[56]               References Cited

U.S. PATENT DOCUMENTS

| | | | |
|---|---|---|---|
| 4,792,956 | 12/1988 | Kamin | 372/38 |
| 4,856,011 | 8/1989 | Shimada et al. | 372/38 |
| 4,955,029 | 9/1990 | Lecoy et al. | 372/38 |
| 4,967,417 | 10/1990 | Yamada | 372/38 |
| 4,995,105 | 2/1991 | Wechsler | 372/38 |
| 5,018,155 | 5/1991 | Miyairi | 372/38 |

FOREIGN PATENT DOCUMENTS

| | | |
|---|---|---|
| 4-68585 | 3/1992 | Japan . |
| 2196173 | 4/1988 | United Kingdom . |
| 2245757 | 10/1992 | United Kingdom . |

*Primary Examiner*—Rodney B. Bovernick
*Assistant Examiner*—Robert E. Wise

[57]                ABSTRACT

A semiconductor laser driving circuit includes an adder for adding outputs of a plurality of semiconductor lasers and obtaining an output sum of the semiconductor lasers, and a comparator for comparing the output sum with a reference signal which is set in advance depending on a desired output sum which is to be obtained, and for outputting a comparison signal which is dependent on a result of the comparision. The light emission powers of each of the semiconductor lasers are controlled based on the comparison signal so that the output sum becomes constant.

11 Claims, 7 Drawing Sheets

SEMICONDUCTOR LASER DRIVING CIRCUIT

BACKGROUND OF THE INVENTION

The present invention generally relates to semiconductor laser driving circuits, and more particularly to a semiconductor laser driving circuit which drives a plurality of semiconductor lasers.

A semiconductor laser is used as a pump light source of an optical amplifier, a light source of a laser printer, a light source of a processing equipment and the like. When using the semiconductor laser as the light source, it is desirable to maintain the light emission quantity of the semiconductor laser constant. Normally, the light emission power of the semiconductor laser is controlled constant by use of an automatic power control (APC) circuit.

FIG. 1 shows an example of a conventional APC circuit. In FIG. 1, an APC circuit 101 includes a comparator 101, a resistor 102, and a current adjusting circuit 103. Vcc denotes a power supply voltage.

A light which is emitted to the rear direction of a semiconductor laser (laser diode) 110 is detected by a photodiode 111, and the photodiode 111 outputs a current which is dependent on the quantity of the detected light. This output current of the photodiode 111 flows through the resistor 102. Hence, a voltage $V_1$ which is dependent on the power of the detected light is applied to one input terminal of the comparator 101. The comparator 101 compares this voltage $V_1$ with a reference voltage $V_{ref}$ which is applied to the other input terminal of the comparator 101, and controls the current adjusting circuit 103 depending on a result of the comparison. Hence, a current which flows through the semiconductor laser 110 is adjusted by the current adjusting circuit 103, so that the light emission power of the semiconductor laser 110 becomes constant.

In the optical amplifier or the like, the required light emission power of the pump light source cannot be obtained by use of a single semiconductor laser. Hence, a predetermined light emission power is obtained by adding outputs of two or more semiconductor lasers. Even in such a case, it is necessary to control a sum of the outputs of the two or more semiconductor lasers constant.

FIG. 2 shows a conceivable semiconductor laser driving circuit for controlling an output sum of n semiconductor lasers constant. In FIG. 2, those parts which are the same as those corresponding parts in FIG. 1 are designated by the same reference numerals, and a description thereof will be omitted. In FIG. 2, a coupler 150 obtains and outputs an summed output of n semiconductor lasers $110_1$ through $110_n$. In addition, an APC circuit $100_i$ is provided with respect to each semiconductor laser $110_i$, where i=1, ..., n.

In the conceivable semiconductor laser driving circuit shown in FIG. 2, one APC circuit $100_i$ is provided with respect to each semiconductor laser $110_i$, the light emission power of each semiconductor laser $110_i$ is controlled to be constant, so as to control the output sum constant. For this reason, there is a problem in that an independent reference voltage $V_{refi}$ must be set with respect to each APC circuit $100_i$ by taking into consideration the individual characteristic of each semiconductor laser $100_i$ which deviates among the semiconductor lasers. However, it requires extremely troublesome adjustments in order to set the reference voltage $V_{refi}$ with respect to each APC circuit $100_i$.

On the other hand, even if one semiconductor laser $110_j$ out of the n semiconductor lasers $110_1$ through $110_n$ fails or its characteristic deteriorates for some reason, for example, information related to the failure or change occurring in the semiconductor laser $110_j$ is not notified to the APC circuits which are provided with respect to the remaining semiconductor lasers. For this reason, even if only one semiconductor laser $110_j$ fails or its characteristic deteriorates, for example, there is a problem in that the output sum output from the coupler 150 changes. For example, if one semiconductor laser $110_j$ fails, the output sum output from the coupler 150 decreases by an amount corresponding to the light emission power of one semiconductor laser, and the reliability of the light source greatly deteriorates if this output sum is used as the output of the light source.

SUMMARY OF THE INVENTION

Accordingly, it is a general object of the present invention to provide a novel and useful semiconductor laser driving circuit in which the problems described above are eliminated.

Another and more specific object of the present invention is to provide a semiconductor laser driving circuit which controls each semiconductor laser based on an output sum of a plurality of semiconductor lasers, so that the output sum can accurately be controlled constant without the need to carry out the complicated operation of setting reference voltages.

Still another object of the present invention is to provide a semiconductor laser driving circuit comprising adder means for adding outputs of a plurality of semiconductor lasers and obtaining an output sum of the semiconductor lasers, and comparator means for comparing the summed output with a reference signal which is set in advance depending on a desired output sum which is to be obtained, and for outputting a comparison signal which is dependent on a result of the comparison, where light emission power of each of the semiconductor lasers is controlled based on the comparison signal so that the summed output becomes constant. According to the semiconductor laser driving circuit of the present invention, it is only necessary to set one reference signal with respect to a plurality of semiconductor lasers. In addition, even if one semiconductor laser fails, for example, it is possible to compensate for the decrease in the summed output by controlling the remaining semiconductor lasers. As a result, it is possible to always accurately control the output sum of the semiconductor lasers constant.

Other objects and further features of the present invention will be apparent from the following detailed description when read in conjunction with the accompanying drawings.

DESCRIPTION OF THE PREFERRED EMBODIMENTS

Figure 3:
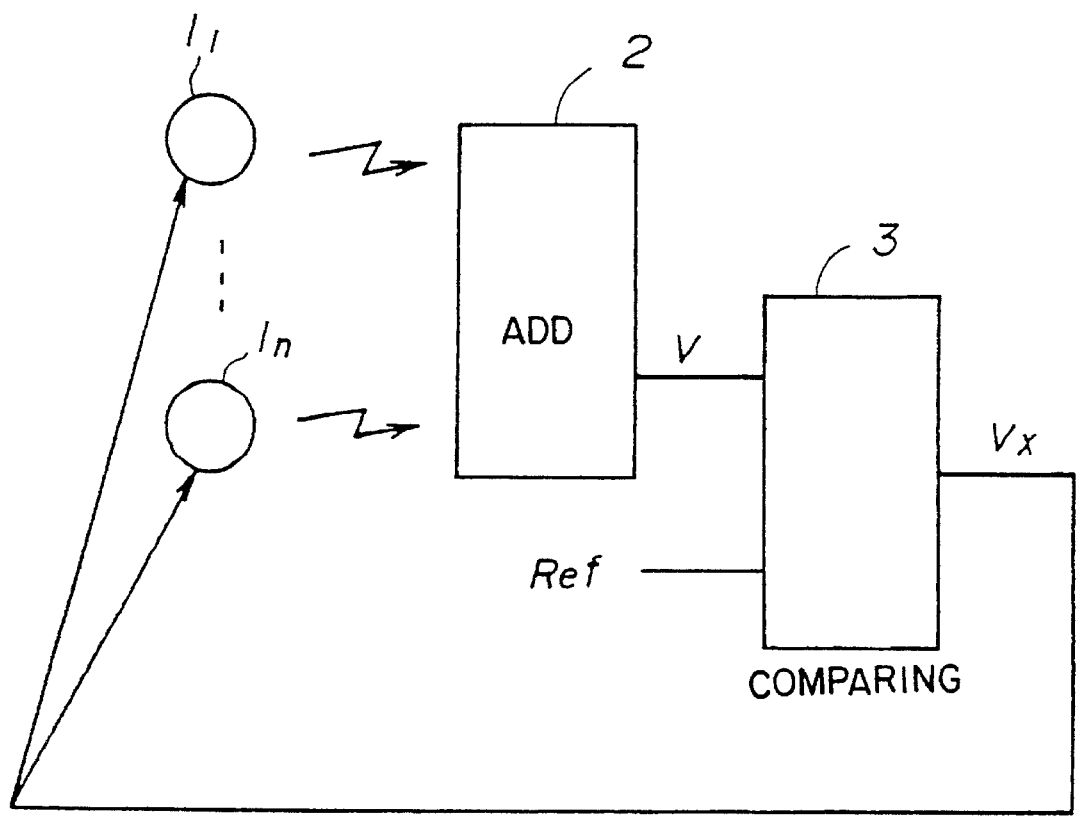
FIG. 3 is a system block diagram for explaining the operating principle of the present invention.

First, a description will be given of the operating principle of the present invention, by referring to FIG. 3. In FIG. 3, an adding part 2 obtains an output sum voltage V by adding outputs of n semiconductor lasers $1_1$ through $1_n$, and supplies this output sum V to a comparator part 3. The comparator part 3 compares the output sum V with a reference signal Ref, and outputs a comparison result $V_x$. Each of the semiconductor lasers $1_1$ through $1_n$ are controlled based on the comparison result $V_x$. The reference signal Ref is set in advance depending on the output sum which is to be obtained.

Since each of the semiconductor lasers $1_1$ through $1_n$ are controlled based on the comparison result $V_x$ which is obtained by comparing the output sum V and the reference signal Ref, the output sum V is always controlled constant. In addition, only one reference signal Ref needs to be set depending on the output sum which is to be obtained.

Accordingly, even if one semiconductor laser fails, for example, the remaining semiconductor lasers can be controlled so as to compensate for the decrease in the output sum caused by the failed semiconductor laser. As a result, it is possible to always accurately control the output sum of the semiconductor lasers constant.

Figure 1:
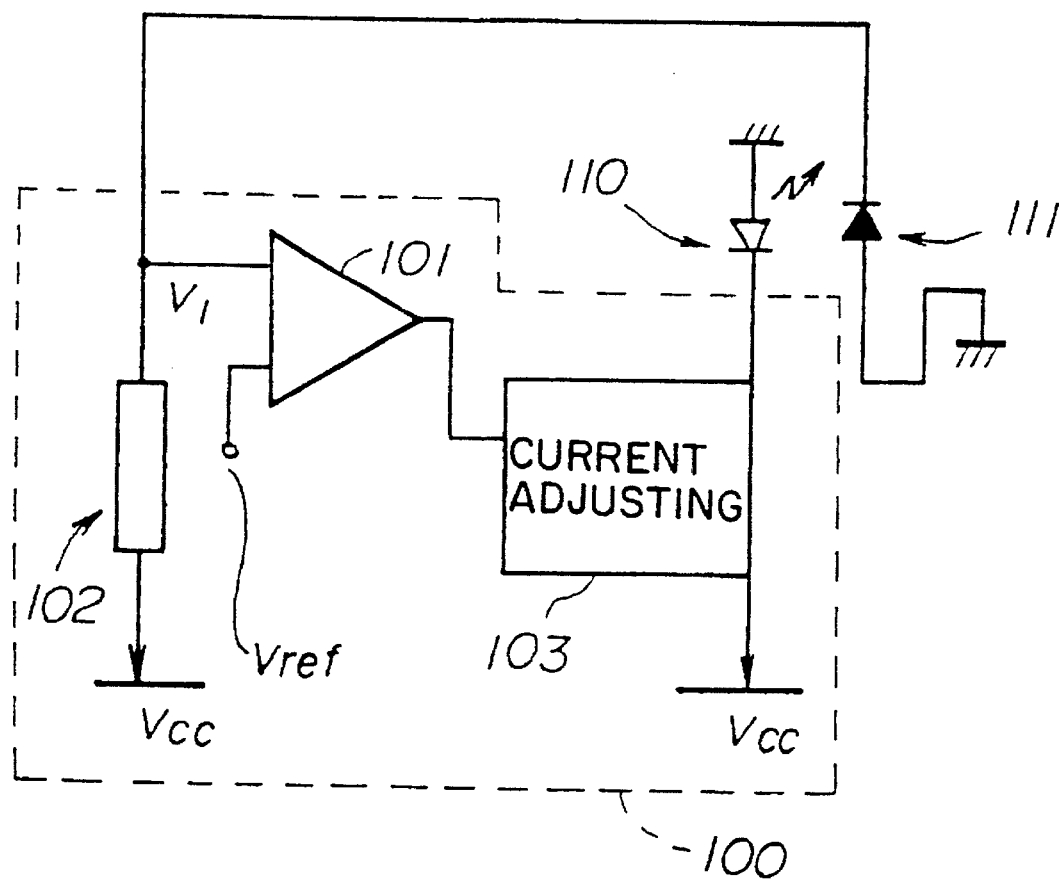
FIG. 1 is a circuit diagram showing an example of a conventional semiconductor laser driving circuit.
Figure 2:
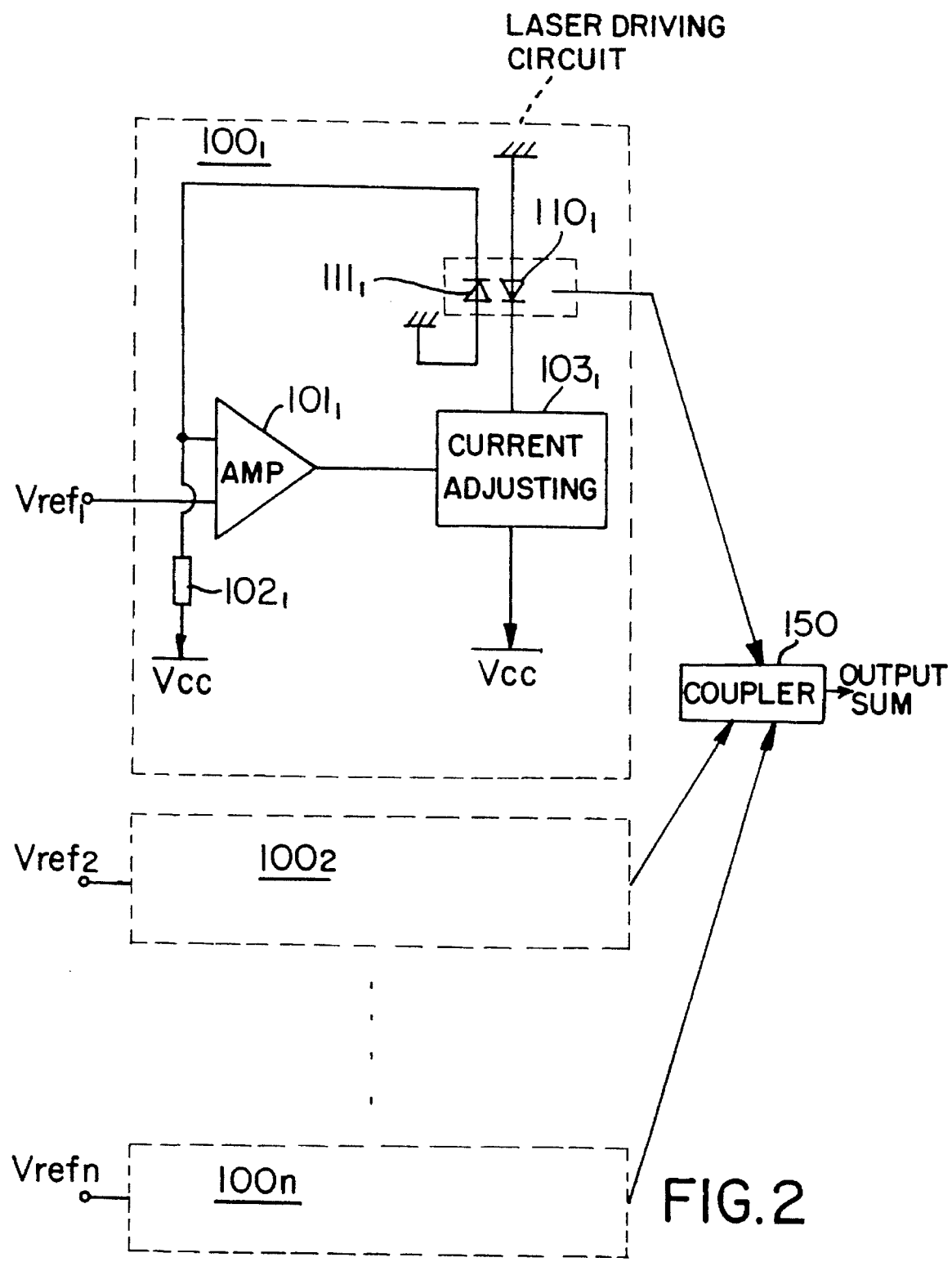
FIG. 2 is a circuit diagram showing a conceivable semiconductor laser driving circuit.
Figure 4:
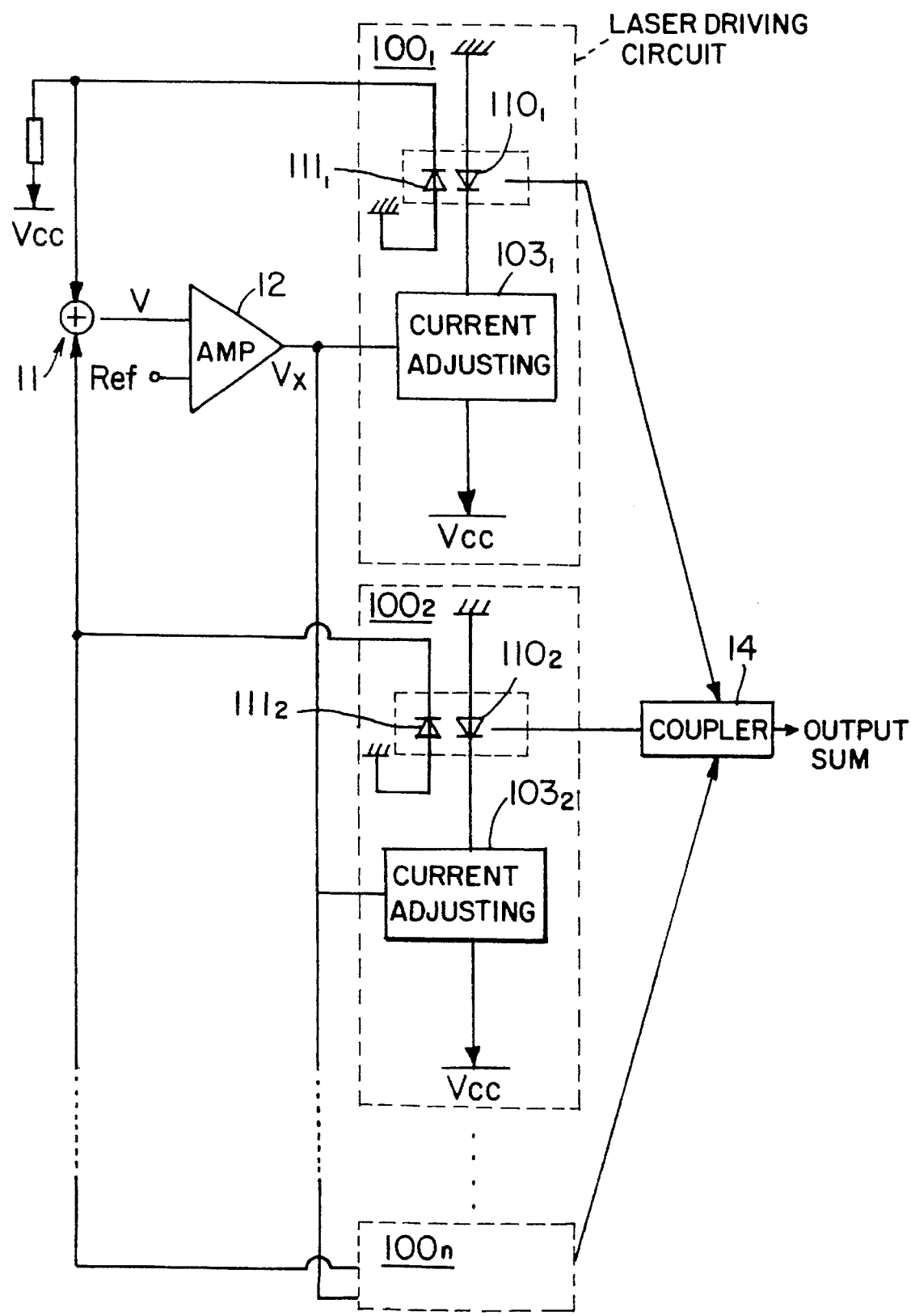
FIG. 4 is a circuit diagram showing a first embodiment of a semiconductor laser driving circuit according to the present invention.

Next, a description will be given of a first embodiment of the semiconductor laser driving circuit according to the present invention, by referring to FIG. 4. In FIG. 4, those parts which are the same as those corresponding parts in FIGS. 1 and 2 are designated by the same reference numerals, and a description thereof will be omitted.

In this embodiment, an adder 11 adds voltages which are dependent on the outputs of the n semiconductor lasers (laser diodes) $110_1$ through $110_n$, and outputs a voltage V which is dependent on the output summed of the semiconductor lasers $110_1$ through $110_n$. This voltage V is compared in a comparator 12 with a reference voltage Ref which is set in advance based on the output sum which is to be obtained. The comparator 12 outputs a signal $V_x$ which is indicative of a result of the comparison which is made in the comparator 12. This signal $V_x$ is supplied in common to current adjusting circuits $103_1$ through $103_n$ which are provided with respect to the corresponding semiconductor lasers $110_1$ through $110_n$. As a result, the light emission powers of the semiconductor lasers $110_1$ through $110_n$ are independently controlled by the corresponding current adjusting circuits $103_1$ through $103_n$, so that an output sum of the semiconductor lasers $110_1$ through $110_n$ output from a coupler 14 becomes constant. Accordingly, even if one semiconductor laser rails and its light emission power becomes zero, for example, the remaining semiconductor lasers are controlled so as to compensate for the decrease in the summed output. Therefore, it is possible to always maintain the output sum from the coupler 14 constant.

Figure 5:
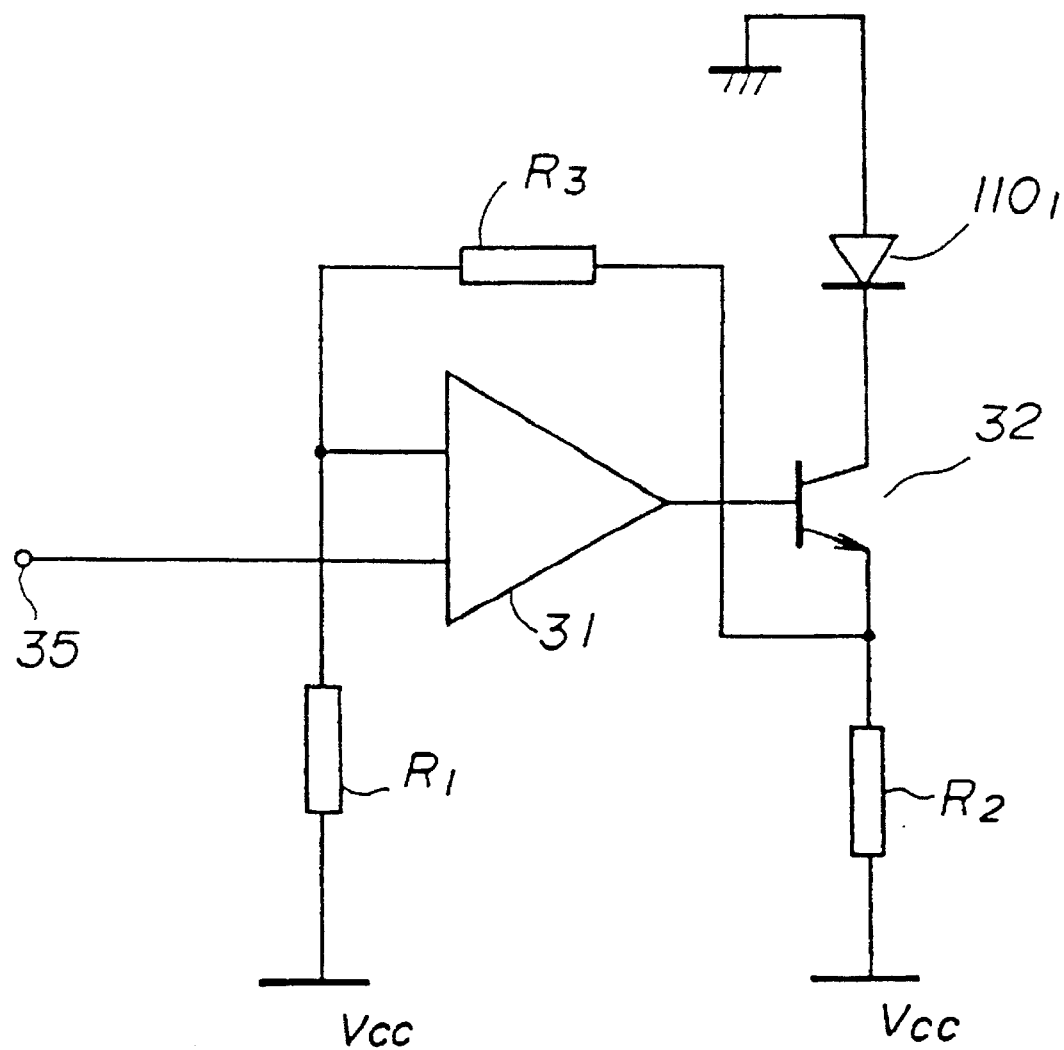
FIG. 5 is a circuit diagram showing an embodiment of a current adjusting circuit.

FIG. 5 shows an embodiment of the current adjusting circuit $103_1$. The remaining current adjusting circuits $103_2$ through $103_n$ have the same construction as the current adjusting circuit $103_1$, and a description and illustration thereof will be omitted. In FIG. 5, the current adjusting circuit $103_1$ includes an operational amplifier 31, a transistor 32, and resistors $R_1$ through $R_3$ which are connected as shown. The output signal $V_x$ of the comparator 12 is applied to a terminal 35, and a current flowing through the semiconductor laser $110_1$ is adjusted so as to become constant by a feedback through the resistor $R_3$.

Next, a description will be given of a second embodiment of the semiconductor laser driving circuit according to the present invention.

In the first embodiment described above, the sensitivities of the current adjusting circuits $103_1$ through $103_n$ are the same, and the semiconductor lasers $110_1$ through $110_n$ are controlled in the same manner. However, in this second embodiment, the sensitivity of each of the current adjusting circuits $103_1$ through $103_n$ is set arbitrarily. As a result, each of the semiconductor lasers $110_1$ through $110_n$ can be controlled with an arbitrary weighting.

According this embodiment, the control range of the light emission power can be variably set for each of the semiconductor lasers $110_1$ through $110_n$. Hence, the sensitivity of each of the current adjusting circuits $103_1$ through $103_n$ can be set arbitrarily by independently setting the resistance of the resistor $R_3$ in FIG. 5. When carrying out the weighting, it is also possible to selectively turn ON/OFF arbitrary one or some out of the n semiconductor lasers $110_1$ through $110_n$.

Next, a description will be given of a third embodiment of the semiconductor laser driving circuit according to the present invention.

In the first and second embodiments described above, each of the photodiodes $111_1$ through $111_n$ detect the lights which are emitted in the rear direction of the corresponding semiconductor lasers $110_1$ through $110_n$. Such light detections are made because the light emission power towards the rear direction of the semiconductor laser is proportional to the light emission power towards the front direction of the semiconductor laser. However, there are cases where the light emission power cannot be controlled accurately unless the light emission quantity towards the front direction of the semiconductor laser is detected.

Hence, in this embodiment, the photodiodes $111_1$ through $111_n$ are arranged at positions so as to detect the lights emitted towards the front direction of the corresponding semiconductor lasers $110_1$ through $110_n$. When detecting the light emitted towards the front direction of the semiconductor laser, a part of the light emitted towards the front direction is usually detected by splitting the light by a known means. However, the techniques for splitting the light which is emitted towards the front direction of the semiconductor laser and the techniques for detecting such part of the split light are known, and a detailed description and illustration of such techniques will be omitted in this specification.

Next, a description will be given of a fourth embodiment of the semiconductor laser driving circuit according to the present invention.

In each of the embodiments described above, each semiconductor laser is made up of a single laser diode as shown in FIG. 4. However, each semiconductor laser may be formed by connecting a plurality of laser diodes in series. Hence, in this fourth embodiment, at least one of the semiconductor lasers $110_1$ through $110_n$ is made up of a plurality of laser diodes which are connected in series, although an illustration thereof will be omitted in this specification. When a plurality of laser diodes are connected in series to form one semiconductor laser, the variable range of the light emission power of the semiconductor laser can be set large.

Next, a description will be given of methods of obtaining the output sum V by the adder 11 in each of the embodiments described above, by referring to FIG. 6. FIG. 6 shows only an essential part of FIG. 4.

Figure 6A:
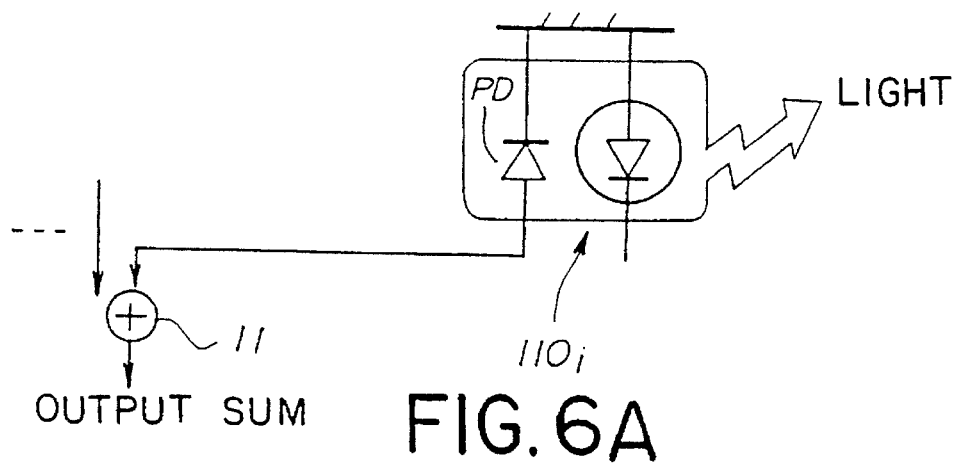
FIG. 6 in parts (a), (b) and (c) shows a diagram for explaining methods of obtaining an output sum.

According to the method shown in FIG. 6(a), each semiconductor laser (laser diode) $110_i$ has a built-in photodiode PD for detecting the output light of the semiconductor laser $110_i$, where i=1, ..., n. Hence, the adder 11 obtains the output sum V of the semiconductor lasers $110_1$ through $110_n$ by adding currents which are obtained from the built-in photodiodes PD of each of the semiconductor lasers $110_1$ through $110_n$.

Figure 6B:
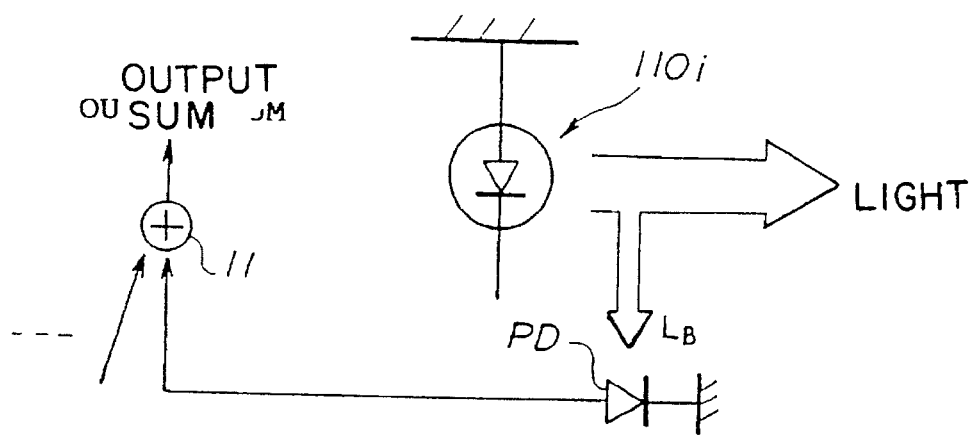

On the other hand, according to the method shown in FIG. 6(b), a split light $L_B$ which is obtained by splitting the light which is emitted towards the front direction of each semiconductor laser $110_i$ is detected by the corresponding photodiode PD which is provided with respect to the semiconductor laser $110_i$, where i=1, ..., n. The adder 11 obtains the output sum V of the semiconductor lasers $110_1$ through $110_n$ by adding currents which are obtained from the photodiodes PD of each of the semiconductor lasers $110_1$ through $110_n$.

According to the methods described above in conjunction with FIGS. 6(a) and (b), each photodiode PD corresponds to the photodiode $111_i$ shown in FIG. 4, where i=1, ... n.

Figure 6C:
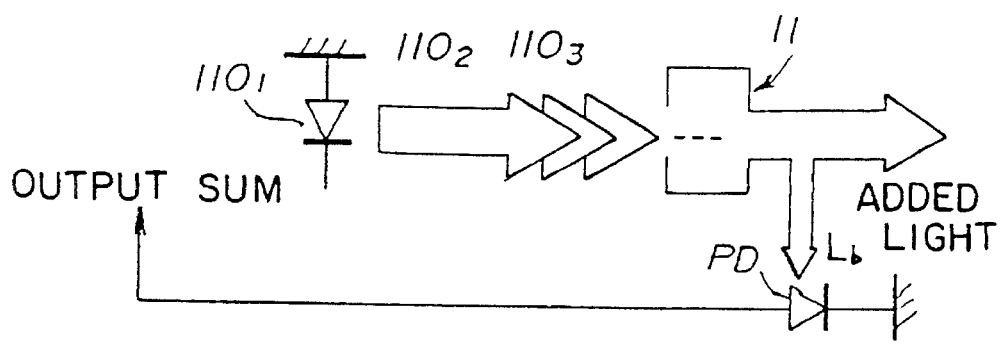

Furthermore, according to the method shown in FIG. 6(c), the lights emitted towards the front direction of each of the semiconductor lasers $110_1$ through $110_n$ are added (or coupled) by the adder (or coupler) 11, and a split light $L_B$ is obtained by splitting a part of the added light. This split light $L_B$ is detected by the photodiode PD, and a current from this photodiode PD is obtained as the output sum V of the semiconductor lasers $110_1$ through $110_n$.

Of course, the method of obtaining the output sum V of the semiconductor lasers $110_1$ through $110_n$ is not limited to those described above in conjunction with FIG. 6.

Next, a description will be given of applications of the present invention, by referring to FIG. 7. In FIGS. 7, (a) and (b) both show cases where the present invention is applied to an optical amplifier which uses a pump light source.

Figure 7A:
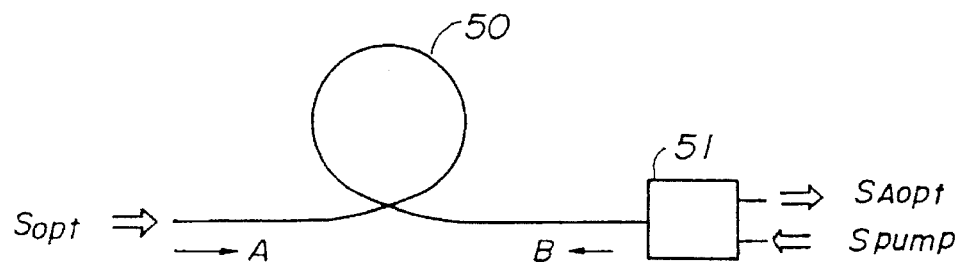
FIG. 7 in parts (a) and (b) shows a diagram for explaining applications of the present invention.

In the case of the optical amplifier shown in FIG. 7(a), an optical signal $S_{opt}$ having a wavelength of 1.55 μm, for example, is input in a direction A to an erbium-doped (Er-doped) optical fiber 50. On the other hand, a pump optical signal $S_{pump}$ from a pump light source (not shown) having a wavelength of 1.48 μm, for example, is input in a direction B which is opposite to the direction A with respect to the optical fiber 50 via a multiplexer 51. In other words, by exciting the Er ions within the optical fiber 50 in advance by the pump optical signal $S_{pump}$, the activated (or pumped) Er ions are induced to the restricted state by the input of the optical signal $S_{opt}$, and the optical signal $S_{opt}$ is amplified by a corresponding amount and output as an amplified optical signal $S_{Aopt}$.

Figure 7B:
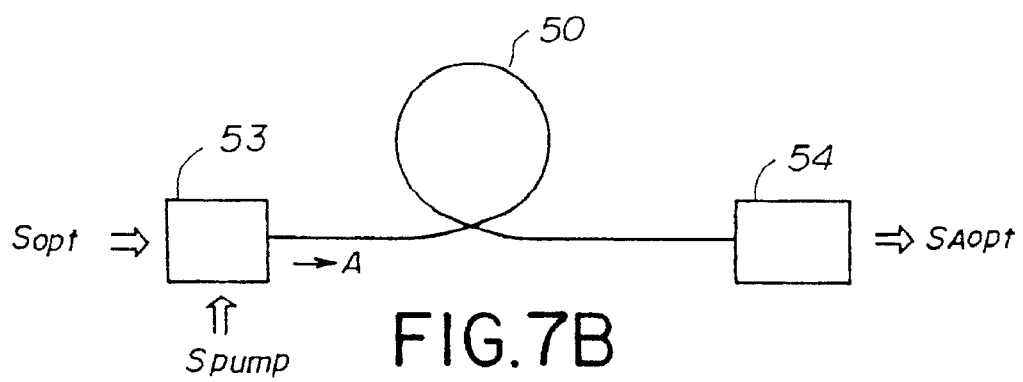

On the other hand, in the case of the optical amplifier shown in FIG. 7(b), both the optical signal $S_{opt}$ and the pump optical signal $S_{pump}$ are input in the direction A. For this reason, a multiplexer 53 and a branching filter 54 are provided. However, the operating principle is basically the same as the case shown in FIG. 7(a) described above.

In optical amplifiers such as those described above with reference to FIG. 7, the pump light source which outputs the pump optical signal $S_{pump}$ must produce a high output with a high reliability. The use of a plurality of semiconductor lasers is effective in order to obtain such a high output from the pump light source. Accordingly, it is possible to realize a pump light source which produces a high output with a high reliability, by controlling the plurality of semiconductor lasers using the semiconductor laser driving circuit according to the present invention.

Of course, the application of the present invention is not limited to the optical amplifier.

Further, the present invention is not limited to these embodiments, but various variations and modifications may be made without departing from the scope of the present invention.

What is claimed is:

1. A semiconductor laser driving circuit comprising:

detecting means for detecting light emission powers of a plurality of semiconductor lasers;

adder means for adding the light emission powers of said plurality of semiconductor lasers, detected by said detecting means and producing an output signal representing a sum of the light emission powers of said semiconductor lasers; and comparator means for comparing the output signal representing said sum with a reference signal which is set in advance depending on a desired output signal representing a sum of the light emission powers of said semi-conductor lasers, which is to be obtained, and for outputting a comparison signal which is dependent on a result of the comparison, the light emission power of each of the semiconductor lasers being controlled based on the comparison signal so that said output signal representing said sum of the light emission powers becomes constant.

2. The semiconductor laser driving circuit as claimed in claim 1, which further comprises current adjusting means, coupled to said comparator means, for controlling the light emission power of each of the semiconductor lasers based on the comparison signal with an arbitrary weighting.

3. The semiconductor laser driving circuit as claimed in claim 1, wherein said detection means detects lights emitted in a front or rear direction of each of the semiconductor lasers and produces signals dependent on the detected lights, said adder means producing said output signal by adding said signals of said detection means.

4. The semiconductor laser driving circuit as claimed in claim 1, wherein at least one of the semiconductor lasers is formed by a plurality of laser diodes which are connected in series.

5. The semiconductor laser driving circuit as claimed in claim 1, wherein the sum of the light emission powers of said semiconductor lasers is used as a pump light of an optical amplifier.

6. The semiconductor laser driving circuit as claimed in claim 1, wherein said adder means produces the output signal by adding voltages corresponding to currents flowing through photodiodes which are built into the corresponding semiconductor lasers.

7. The semiconductor laser driving circuit as claimed in claim 1, wherein said adder means produces the output signal by adding voltages corresponding to currents flowing through photodiodes which are provided with respect to each of the semiconductor lasers and each detect a split light which is obtained by splitting a part of the light which is emitted in a front direction of a corresponding one of the semiconductor lasers.

8. The semiconductor laser driving circuit as claimed in claim 1, wherein said coupling means comprises means for adding lights which are emitted in a front direction of each of the semiconductor lasers and for obtaining a split light by splitting a part of the added light; and wherein said detecting means comprises at least one photodiode for detecting the split light and outputs a voltage dependent on a current flowing through the photodiode in accordance with the output light.

9. A semiconductor laser driving circuit comprising:

coupling means for coupling lights emitted from a plurality of semiconductor lasers and producing an output light representing a sum of lights from said plurality of semiconductor lasers;

detecting means for detecting a light emission power of the output light obtained by said coupling means; and comparator means for comparing the light emission power of the output light with a reference signal which is set in advance depending on a desired output light which is to be obtained, and for outputting a comparison signal which is dependent on a result of the comparison, wherein light emission power of each of the semiconductor lasers is controlled based on the comparison signal so that the light emission power of the output light becomes constant such that in case one of said semiconductor lasers fails, remaining semiconductor lasers are controlled so as to compensate for a change in said output light caused by failure of said one of said semiconductor lasers.

10. The semiconductor laser driving circuit as claimed in claim 9, wherein at least one of the semiconductor lasers is formed by a plurality of laser diodes which are connected in series.

11. The semiconductor laser driving circuit as claimed in claim 9, wherein the output light of the semiconductor lasers is used as a pump light of an optical amplifier.

* * * * *